(12) United States Patent
Pace

(10) Patent No.: US 8,471,607 B1
(45) Date of Patent: Jun. 25, 2013

(54) HIGH-SPEED FREQUENCY DIVIDER ARCHITECTURE

(75) Inventor: Ferdinando Pace, Birmensdorf (CH)

(73) Assignee: St-Ericsson SA, Plan-les-Ouates (CH)

( * ) Notice: Subject to any disclaimer, the term of this patent is extended or adjusted under 35 U.S.C. 154(b) by 0 days.

(21) Appl. No.: 13/341,402

(22) Filed: Dec. 30, 2011

(51) Int. Cl.
*H03B 19/00* (2006.01)

(52) U.S. Cl.
USPC .......................................... 327/115; 327/117

(58) Field of Classification Search
USPC ............... 327/113–115, 117, 118; 377/47–48
See application file for complete search history.

(56) References Cited

U.S. PATENT DOCUMENTS

| | | | |
|---|---|---|---|
| 5,526,390 A | 6/1996 | Fucili | |
| 6,630,849 B2 | 10/2003 | Dellow | |
| 7,012,455 B2* | 3/2006 | Chen | 327/115 |
| 7,342,425 B1* | 3/2008 | Kang | 327/115 |
| 2002/0036935 A1 | 3/2002 | Park et al. | |
| 2007/0079164 A1 | 4/2007 | Duvillard et al. | |
| 2008/0297209 A1 | 12/2008 | Scuteri | |

FOREIGN PATENT DOCUMENTS

CN 101291149 A 10/2008

* cited by examiner

*Primary Examiner* — Long Nguyen
(74) *Attorney, Agent, or Firm* — Howison & Arnott, L.L.P.

(57) ABSTRACT

A high speed clock frequency divider circuit is provided that uses a first shift register loop-back circuit and a second shift-register loop-back circuit to shift a predetermined array of bits therethrough. The first shift register loop-back circuit is clocked on a rising clock edge of an input clock signal, while the second shift register loop-back signal is clocked on a negative edge of the input clock signal. The outputs of the first and second loop-back shift registers are ORed to provide a 50% duty cycle output clock signal.

20 Claims, 8 Drawing Sheets

HIGH-SPEED FREQUENCY DIVIDER ARCHITECTURE

TECHNICAL FIELD

Embodiments of the invention relate to frequency divider circuits.

BACKGROUND

Electronic circuitry used in, for example, transportation, personal or industrial computing, technology research and development or, mobile communication devices, requires clock signals derived from frequency division circuitry. For example, in the receiver portion of a transceiver, a local oscillator (LO) frequency is typically a division of a given reference frequency. A frequency divider is often included in phase locked loop (PLL) circuits to generate a desired LO frequency. In research and development labs high speed clock generators of fixed and selectable frequencies are often needed.

Referring to FIG. 1, a basic block diagram of a frequency divider 100 is provided. A clock-in signal 102 is input into the frequency divider 100. The DIV input 104 represents a desired division ratio. DIV is sometimes an array or vector of N+1 bits for indicating the division ratio. For example, to represent a division ratio ranging from 1-8, an array of 3 or more bits could be used. The load signal 106 is a signal used to load a state in the frequency divider 100 such that the proper division ratio of the clock-in signal 102 will be performed. The clock-out signal 108 is the resultant divided down output signal.

FIG. 2 is a block diagram of a prior art frequency divider 200. The core of this frequency divider is a counter 202, which counts according to the division ratio set by the DIV input 204. The counter 202 counts the clock cycles of the clock input 206 to enable generation of a count waveform 208 that has a frequency equal to the frequency of the clock input 206 divided by the division ratio represented by DIV 204. The additional logic 210 handles both odd and even division ratio inputs. Negative edges of the clock input 206 can be used in the processing of odd division ratios and thereby provide a balanced 50/50 duty cycle clock output 212. If the division ratio, DIV 204 is "large", for example between 4 and 1024, then the increased complexity of the counter block 202 creates a substantial design limitation on the allowable maximum clock-in frequency 206. This is due to the logic in the counter 202 becoming more complex as the DIV number becomes larger thereby having a consequence of creating a critical delay time for the timing of the counter circuitry 202 to creation of the clock-out signal 212 with respect to the clock-in signal 206. It has been shown through computer analysis that when using CMOS040 technology (CMOS-40 nm technology) the maximum frequency for the clock-in signal 206 is about 910 MHz when N equals 3 (i.e., N+1=4 bits) and the division ratio input 204 has a value ranging from 1 to 16. Creating high frequency division circuits using prior art counter-style frequency divider cannot physically operate at frequencies over about 910 MHz and operate with a division ratio greater than 16 using CMOS-40 nm technology.

Thus, a problem that needs to be addressed is to resolve how to minimize the critical timing delay in a frequency divider circuit when division ratio 204 is a large number (i.e., represented as a division ratio between 4 and 1024). For example, if a clock-in signal 206 is 910 MHz (which is less than 1 GHz) the needed division ratio is 7, then this prior art frequency divider will work properly. But, for example, if the needed division ratio is 18 or more then the frequency division of this prior art frequency divider 200 becomes impossible because there is not enough set-up time for the flip-flop devices within the counter block 202 to operate correctly. Therefore, what is needed is a frequency division design that allows for frequency division of a clock input such that whatever number is set or selected as the division ratio, substantially the same performance of the division aspect of the frequency division circuitry is provided regardless of how complex or large the division circuit becomes.

Additionally, it would be advantageous to provide such a high speed clock frequency divider architecture that can provide the 50% duty cycle clock-output when the set or selected ratio is an odd or even positive integer.

SUMMARY

In order to solve some of the drawbacks of prior high speed frequency divider circuitry, exemplary embodiments of the present invention provide a high speed clock frequency divider circuit that uses a first shift register loop-back circuit and a second shift-register loop-back circuit to shift a predetermined array of bits therethrough. The first shift register loop-back circuit is clocked on a rising clock edge of an input clock signal, while the second shift register loop-back signal is clocked on a negative edge of the input clock signal. The outputs of the first and second loop-back shift registers are ORed to provide a 50% duty cycle output clock signal. An exemplary frequency divider can operate at a maximum clock speed allowable by the shift register flip-flop cell circuitry.

An embodiment of the invention provides a frequency divider architecture having a first and a second loop-back flip-flop circuit. The first loop-back flip-flop circuit comprises a first plurality of N flip-flops connected in a first series such that a Q output of each of the N flip-flops in the first series is connected to a D input of an immediately following flip-flop in the first series of flip-flops. There is also a first loop-back connection that connects the Q output of a last flip-flop in the first series with a D input of a first flip-flop in the first series of flip-flops. The first loop-back flip-flop circuit further includes a first reset signal line connected to a set input of each of the N flip-flops in the first series of flip-flops; the first reset signal line is adapted to reset each of the N flip-flops to a first logic level or a second logic level in a first predetermined configuration. Additionally, there is a clock signal input line that is adapted to provide an input clock signal, the clock signal input line is connected to each of the N flip-flops in the first series of flip-flops such that the N flip flops in the first series of flip-flops are clocked on a rising clock edge of the input clock signal. Also the first loop-back flip-flop circuit has a first clock output line connected to the first loop-back connection.

The second loop-back flip-flop circuit, in some embodiments is similar to the first loop-back circuit in that the second loop-back circuit comprises a second plurality of M flip-flops connected in a second series such that a Q output of each of the M flip-flops in the second series is connected to a D input of an immediately following flip-flop in the second series of flip-flops. There is also a second loop-back connection that connects the Q output of a last flip-flop in the second series with a D input of a first flip in the second series of flip-flops. The second loop-back flip-flop circuit further includes a second reset signal line connected to each of the M flip-flops in the second series of flip-flops; the second reset signal line is adapted to reset each of the M flip-flops to a first logic level or a second logic level in a second predetermined configuration. Additionally, the clock signal input line is connected to each of the M flip-flops such that the M flip-flops are clocked on a falling clock edge of the input clock signal. Also, the loop-back flip-flop circuit has a second clock output line connected to the second loop-back connection. Additionally, an OR gate having a first input of the OR gate connected to the first clock output line, a second input of the OR gate connected to the second clock output line, and an output for providing an output clock signal having a period that is a integer multiple of an input period of the input clock signal provided on the clock signal input line.

In additional embodiments of the frequency divider architecture the number of N flip-flops is equal to the number of M flip-flops and the second reset signal line is connected to the first reset signal line, whereby the first reset signal and the second reset signal employ the a same reset signal.

Some exemplary frequency divider architectures have a same number of N flip-flops as M flip-flops. In some additional embodiments the numbers N and M are equal and odd numbers; and further provide an output clock signal that has a 50% duty cycle.

Additional embodiments of the exemplary frequency divider architecture comprises an odd number of N flip-flops wherein the exemplary frequency divider architecture is adapted to provide a single division ratio of the input clock signal, and wherein and the first reset signal line is adapted to SET the N flip flops such that the first predetermined configuration comprises the first $[(N/2)-0.5]$ flip flops being set to the first logic level and the next $[(N/2)+0.5]$ flip flops being set to the second logic level. In some of the same embodiments, the exemplary frequency divider architecture has M equal to N and the second reset signal line is adapted to SET the M flip flops such that the second predetermined configuration comprises the first $[(M/2)-0.5]$ flip flops being set to the first logic level and the next $[(M/2)+0.5]$ flip flops being set to the second logic level.

In various embodiments of exemplary frequency divider architectures, the division ratio of the output clock frequency is fixed by the number of N and M flip-flops.

Yet in other embodiments of exemplary frequency divider architectures, the frequency divider architecture is programmable, via the reset signal line, so as to provide an output clock signal having a division ratio comprising any of the factors of N except 1 and provide the output clock signal with a 50% duty cycle.

In an exemplary method of dividing an input clock by a number in accordance with embodiments of the present invention, the method comprises providing a first plurality of N flip-flops connected in a first loop-back configuration wherein an output of a last flip-flop is connected to an input of a first flip-flop of the first loop-back configuration; providing a second plurality of M flip-flops connected in a second loop-back configuration wherein an output of a last flip-flop is connected to an input of a first flip-flop of the second loop-back configuration; setting a first number of the first plurality of N and the second plurality of M flip-flops to contain a logical 0; setting a second number of the first plurality of N and the second plurality of M flip-flops to contain a logical 1; clocking the first plurality of N flip-flops on a rising edge of an input clock signal; clocking the second plurality of M flip-flops on a falling edge of the input clock signal; and ORing the output of the last flip-flop of the first loop back configuration and the output of the last flip-flop of the second loop-back configuration to provide a clock output signal having a 50% duty cycle and a clock output frequency having a predetermined division ratio with respect to the input clock signal's frequency.

In some embodiments of the exemplary method wherein N and M are equal odd integers, the exemplary method further includes setting the first number of the first plurality of N flip-flops and M flip-flops such that $[(N/2)-0.5]$ consecutive flip-flops are set to a logical 0. Additionally, some exemplary embodiments, wherein N and M are equal odd integers includes setting the second number of the first plurality of N and the second plurality of M flip-flops such that $[(N/2)+0.5]$ consecutive flip-flops are set to a logical 1.

Additional embodiments of the exemplary method further include, prior to setting the first number and setting the second number (discussed above), receiving a division ratio signal by a decoder circuit, wherein the division ratio signal is adapted to comprise a division ratio equal to any factor of N except 1, and providing a reset signal to the decoder circuit thereby triggering the decoder circuit to provide a SET or RESET signal, in accordance with a received division ratio signal, to the first plurality of N flip-flops and the second plurality of M flip-flops.

In other embodiments an exemplary electronic circuit is provided that comprises a frequency divider, wherein the frequency divider comprises a first loop-back flip-flop circuit comprising a first plurality of N of flip-flops connected in a first series comprising a first clock output connection that electrically connects an output of a last flip-flop in the first series to an input of a first flip-flop in the first series. This embodiment also includes a second loop-back flip-flop circuit comprising a second plurality of M flip-flops connected in a second series that comprises a second clock output connection that electrically connects an output of a last flip-flop in the second series to an input of a first flip-flop in the second series. There is also included a reset signal that is adapted to cause a first number of flip-flops in the first loop-back flip-flop circuit to be set to a first logic level and to cause a second number of flip-flops in the second loop-back circuit to be set to the first logic level while the remaining flip-flops in the first and second loop-back circuits are set to a second logic level. The N flip-flops in the first loop-back circuit are adapted to be clocked by a rising edge of an input clock signal while the M flip-flops in the second loop-back circuit are adapted to be clocked by a falling edge of the input clock signal. An OR circuit comprising a first input is connected to the first clock output connection, a second input is connected to the second clock output connection and an output of the OR circuit is adapted to provide an output clock having an output frequency equal to a selected frequency division ratio of the input clock signal an having a 50% duty cycle.

In yet additional embodiments, the electronic circuit has the numbers N and M being equal to each other and odd numbers. Furthermore, the reset signal is adapted to cause a first number of consecutive $[(N/2)-0.5]$ flip-flops in the first loop-back flip-flop circuit and the second loop-back flip-flop circuit to be set to the first logic level and to cause the remaining flip-flops in the first and the second loop-back flip flop circuits to be set to a second logic level.

In additional embodiments of the electronic circuit the selected frequency division ratio of the input clock signal's frequency to the output clock's frequency is equal to the number of N flip-flops.

Another embodiment of the electronic further comprising a decoder circuit adapted to receive both the reset signal and a division ratio signal. The division ratio signal comprising a selected frequency division ratio that can be a factor of N except for 1 and wherein the decoder circuit is further adapted to provide, upon receipt the reset signal and in accordance with the selected frequency division ratio, a SET or RESET signal to each of the first plurality of N flip-flops and each of the second plurality of M flip-flops.

Various embodiments of the invention the frequency divider is adapted to be clocked at an input clock frequency that is equal to or below $1/(t_{clk-Q}+t_s)$, wherein $t_{clk-Q}$ is equal to a maximum rated amount of time for a slowest one of the plurality of N or M flips-flops to output the first or second logic level therein after being clocked by an appropriate edge of the input clock signal, and wherein $t_s$ is equal to a maximum set-up time of for a slowest one of the plurality of N or M flip flops.

Furthermore, embodiments of the invention, the exemplary electronic circuit the frequency divider architecture or method of dividing an input clock frequency by a selected number encompass or are part of a portable computing unit and/or a mobile telephone.

BRIEF DESCRIPTION OF THE DRAWINGS

For a more complete understanding, reference is now made to the following description taken in conjunction with the accompanying Drawings in which.

DETAILED DESCRIPTION

Figure 1:
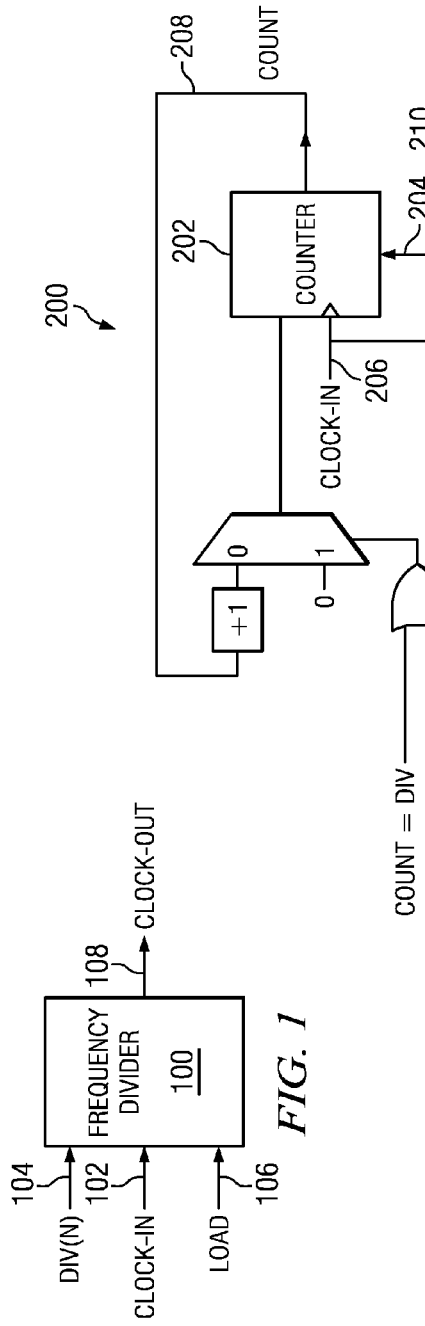
FIG. 1 depicts a basic block diagram of a frequency divider.
Figure 2:
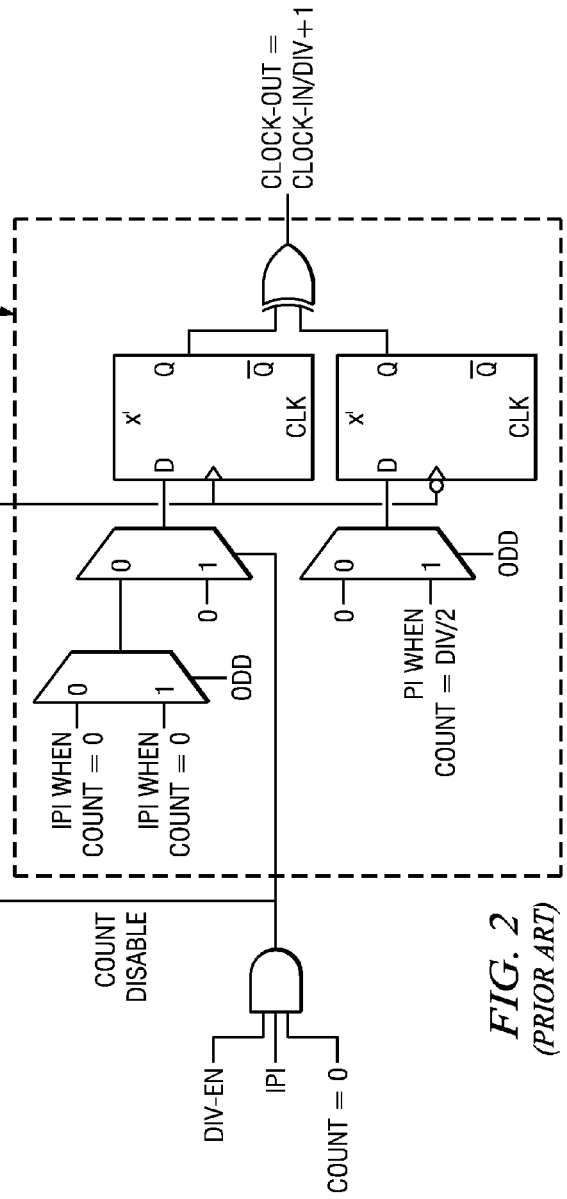
FIG. 2 depicts a block diagram of a prior art counter-style frequency divider.

Referring now to the drawings, wherein like reference numbers are used herein to designate like elements throughout, the various views and embodiments of exemplary high-speed frequency divider architecture are illustrated and described, and other possible embodiments are described. The figures are not necessarily drawn to scale, and in some instances the drawings have been exaggerated and/or simplified in places for illustrative purposes only. One of ordinary skill in the art will appreciate the many possible applications and variations based on the following examples of possible embodiments.

Figure 3:
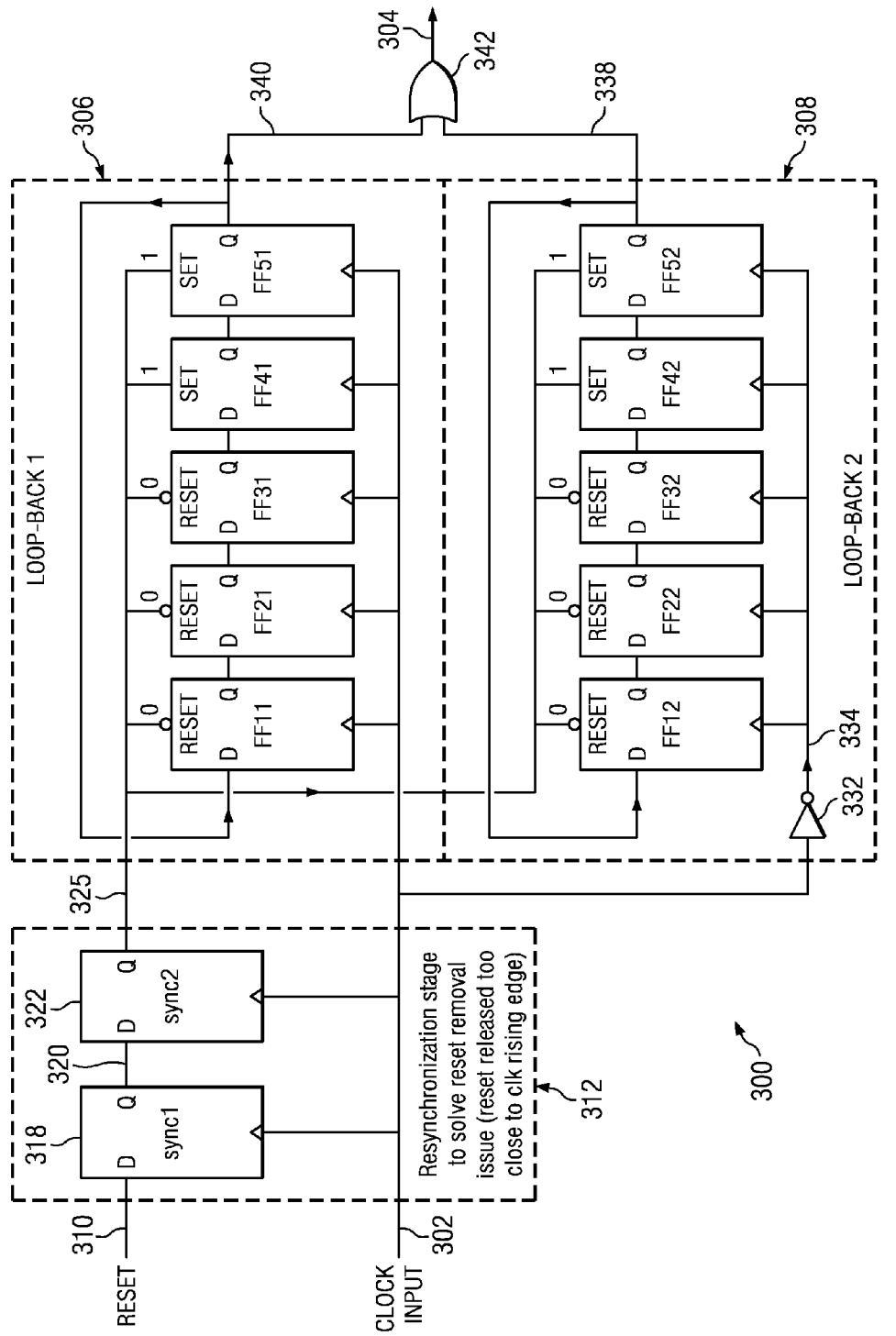
FIG. 3 is a block diagram of an exemplary high speed frequency divider architecture in accordance with an embodiment of the invention.

Referring to FIG. 3, an exemplary high-speed frequency divider 300 is depicted in accordance with an embodiment of the invention. This exemplary frequency divider is adapted to divide a clock input signal 302 by a fixed division ratio that is an odd number. In this embodiment the fixed division ratio is five. As such, the clock out signal 304 will have a clock cycle frequency that is one fifth of the clock input frequency. It should be understood that when discussing clock frequencies, one of ordinary skill in the art would understand that a clock signal is substantially approximates a square wave even at clock frequencies in the 2.5 to 4 GHz or higher range.

The digital divider 300 has two substantially similar shift register circuits or flip-flop circuits with a feedback loop. Each of these shift register or flip-flop circuits with a feedback loop may be commonly called a loop-back shift register. FIG. 3 depicts a first loop-back shift register circuit 306 and a second loop-back shift register circuit 308. In this embodiment the number of flip-flops in each loop-back shift register circuit 306, 308 is equal to the division ratio provided by the digital divider circuit 300. Each of the two loop-back shift register circuits 306, 308 are initiated or reset so as to ultimately produce a predetermined division ratio of an input clock signal. In this embodiment, the first loop-back circuit 306 has flip-flops ff41 and ff51, having an asynchronous set (SET) then are cascaded with a group of flip-flops, for example flip-flops ff11, ff21, ff31, having an asynchronous reset (RESET). The asynchronous set and reset flip-flops are used so that when a reset signal 310 is provided to an exemplary digital divider 300, the flip-flops cascaded in the first loop-back shift register circuit 306 and second loop-back shift register circuit 308 are initialized with predetermined logical voltages representing a high or low (a one or zero) prior to providing the clock input 302.

Figure 4:
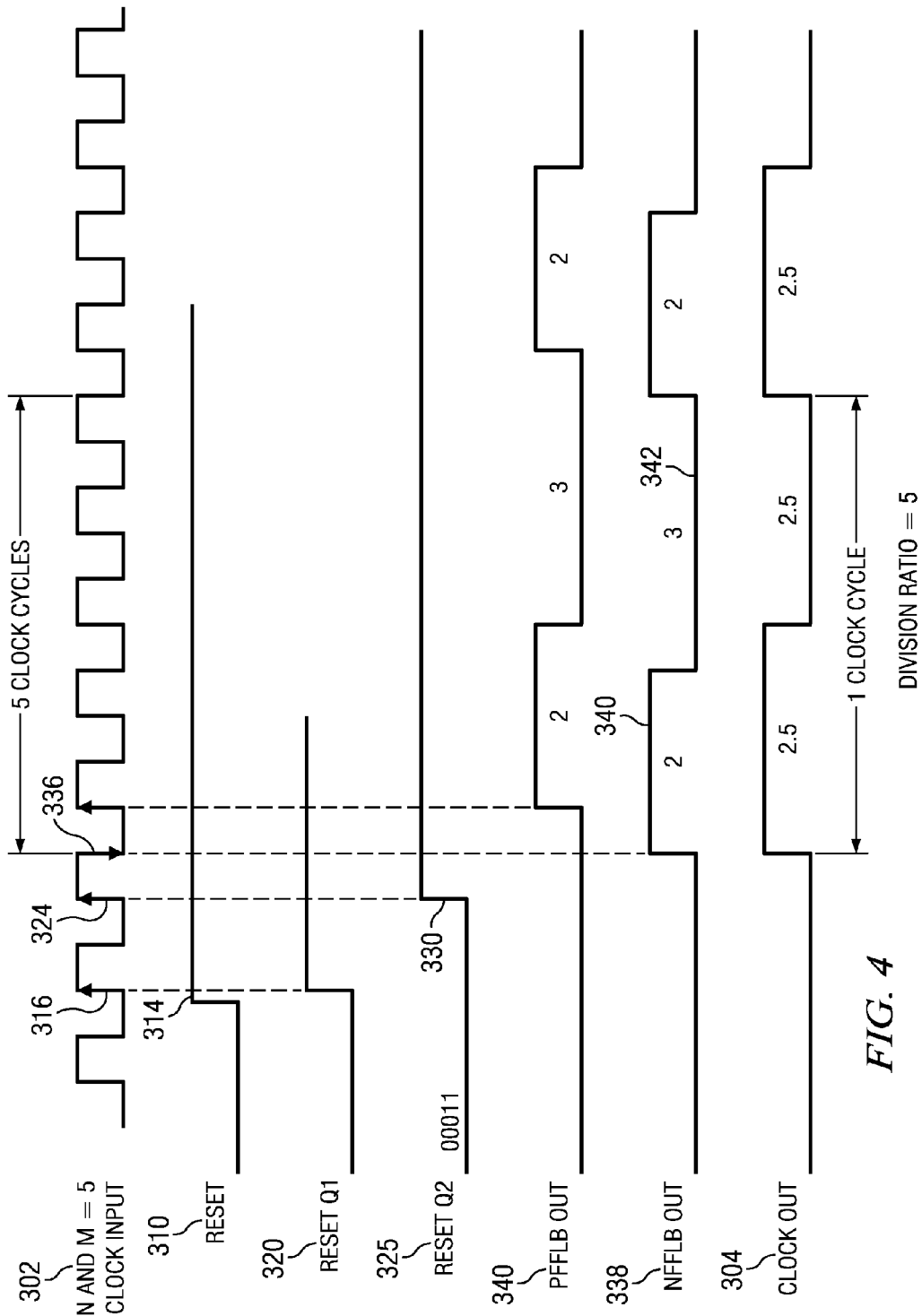
FIG. 4 depicts a timing diagram for the exemplary embodiment depicted in FIG. 3.

Referring now to both FIGS. 3 and 4, wherein FIG. 4 provides an exemplary timing diagram of the digital divider 300 depicted in FIG. 3. Here, there are five, N, flip-flops connected and cascaded in the first 306 and five, M, flip-flops connected and cascaded in the second loop-back shift register circuit 308. Thus, the division ratio for this exemplary digital divider is equal to five In this embodiment a resynchronization stage 312 is provided to solve a potential reset removal issue that could occur in some embodiments when the reset 310 is released, as shown in FIG. 4, too close 314 to a rising edge 316 of the clock input signal 302, which will not provide enough set-up time for the reset signal 310 to set or reset the cascaded groups of flip-flops, having asynchronous set and asynchronous reset capabilities, prior to a next rising edge 316 of the clock input 302. In this embodiment, the reset signal 310 is provided to the input of a first sync flip-flop 318, which provides a reset Q1 one signal 320 at the next rising edge 316 of the clock input 302. The reset Q1 signal 320 is shifted into the input of the second synchronization flip-flop 322 at the next rising edge 324 of the clock input 302. Thus, the output Q of the second synch flip-flop 322 is provided as reset signal Q2 325 so as to RESET predetermined flip-flops of each of the loop-back shift register circuits 306 and 308 to a first logical setting and to SET other predetermined flip-flops in the first and second loop-back shift register circuits 306, 308 to a different logical setting. In the exemplary embodiment shown the first three flip-flops ff11, ff21, ff31 are RESET to a first logical setting, such as a low or logical setting zero while flip-flops ff41, ff51 are set to a second logical setting, a logical high or logical one setting. Similarly, in this embodiment, the second loop-back shift register circuit 308 has the first three flip-flops ff12, ff22, ff32 RESET to the first logical setting, a low or logical zero setting while the remaining two flip-flops ff42, ff52 are set to a second logical setting, logical high or logical one setting.

After the reset Q2, 324 becomes inactive (in this embodiment goes high) 330, then the clock input 302 begins to shift the 00011 logical bit sequence around each of the first and second loop-back shift register circuits 306, 308.

Referring now to the second loop-back shift register circuit 308, the clock input 302 is inverted by the inverter 332 and thus provides an inverted clock 334. The inverted clock 334 essentially clocks the flip-flops ff12, ff22, ff32, ff42, ff52 beginning at the first falling edge 336 of the clock-input signal 302 that follows the reset Q2 signal 324 going to an inactive state 330. In this embodiment the Q output of the Nth (in this embodiment the fifth or last flip-flop ff52) of the second loop-back circuit 308 provides a Negative Flip-Flop/Loop-Back Out Signal (second output signal) 338, which is the shifts contents of the SET and RESET flip-flops of the second loop-back circuit 308. In this embodiment the second output signal 338 is a logical 1 for two clock cycles 340 and then a logical 0 for three clock cycles 342. This sequence of 00011 repeats as the second loop-back circuit 308 continues to be clocked by the inverted clock 334 or the negative clock edges of the clock input 302. Meanwhile, delayed by half a clock input cycle, the first loop-back circuit 306 shifts the Q output of flip-flop ff51 out as the Positive Flip-Flop/Loop-Back Out Signal (first output signal) 340 with each successive rising edge of the clock input 302 so as to produce a repeating 00011 first output signal 340. The first output signal 340 is shown in the signal timing diagram of FIG. 4 to be one half of an input clock cycle behind the second output signal out signal 338. It will be understood that in some embodiments the synchronized reset signal 325 or unsynchronized reset signal 310 can be timed so that the first output signal is clocked so as to be output one half of an input clock cycle ahead of the second output signal.

An OR circuit 342 receives as inputs both of the second output signal 338 and the first output signal 340 signal and logically ORs the signals to produce the clock output 304 which, in this embodiment has a 50% duty cycle and a clock frequency equal to one fifth of the clock input frequency 302.

Embodiments of this invention are well suited high frequency divider circuits used for odd division ratios wherein a 50% duty cycle clock output is needed. Furthermore, embodiments of the invention do not require electronic circuitry or logic such as multiplexers, AND, OR, or inverter circuitry between the Q output and the D input of the flip-flops within either of the first or second loop-back shift register circuits 306, 308 thereby minimizing the signal delay between flip-flops and maximizing the operating clock frequency of an exemplary digital divider to the inverse of the time delay ($T_D$) required to shift each bit from one shift register in the cascade of shift registers to the next shift register. In invention embodiments, this time delay will is equal to the time it takes between a flip-flop receiving a clock input to producing the shifted output at the flip-flop's Q output ($t_{ck-Q}$) plus the set-up time of the next flip-flop in the cascade to receive the previous flip-flops Q output at its D input ($t_{setup}$), which can be shown as the equation $$T_D = t_{ck-Q} + t_{setup}.$$

The maximum clock frequency of an exemplary digital divider is substantially equal to $1/T_D$.

Using present day flip-flop technology the $T_D$ may be in the range of about 0.3 to about 0.4 nsec. Thus, an exemplary maximum operating input clock frequency range may be from about 2.5 GHz to about 3.3 GHz. One of ordinary skill in the art understands that the operating input clock frequency of an exemplary digital divider circuit that provides a 50% duty cycle output for an odd division ratio has a maximum input clock frequency that is limited by the maximum $T_D$ of the slowest flip-flop in either the first or second loop-back shift register circuits 306, 308. Furthermore, as technology advances the maximum $T_D$ will decrease thereby making the maximum clock input frequency increase accordingly.

For some digital divider embodiments that provide odd division ratios, the number, N, of flip-flops in each of the first and second loop-back shift register circuits is equal to the desired odd division ratio. Furthermore, the number of flip-flops in each of the first and second loop-back circuits having an asynchronous SET is equal to [(the odd division ratio divided by 2)−0.5] with the remaining flip-flops in each loop-back shift register circuit having asynchronous RESET. Conversely, in other embodiments the number of flip-flops with an asynchronous RESET may be equal to [(the odd division ratio divided by 2)+0.5] with the remaining number of flip-flops in the loop-back shift register circuit having an asynchronous SET. When an embodiment is configured in this manner, the duty cycle of the output clock will be 50% for an ODD division ratio. It should be further understood that the duty cycle of the output clock can be programmed. For example, if N is equal to 7 flip-flops and 1000000 is programmed via the SET and RESET lines of the flip-flops, then the duty cycle of the output clock will be 1/7% if only the first shift-register is used or the duty cycle will be (1.5)/7%. Note that in embodiments wherein the division ratio is set to be an even number (i.e., N and M are both equal and even numbers), then the number of flip-flops, N, in the first loop-back circuit having an asynchronous SET and initialized on an active reset signal to a first logical level will be equal to trunc[(the even division ratio divided by 2)−0.5] or alternatively [(the even division ratio divided by 2)] with the remaining flip-flops in the first loop-back shift register circuit having an asynchronous RESET and initialized on an active reset signal to a second logical level. Meanwhile, the number of flip-flops, M, in the second loop-back circuit will all be SET (or RESET as the case may be) and initialized on an active reset signal to a logical level that is considered a low logical level so as to not change the first output signal of the first loop-back circuit, when being ORed with the second output signal of the second loop-back circuit, at the output of the OR circuit.

Described yet another way, the first loop-back flip-flop circuit 306 of an exemplary embodiment should have N flip-flops connected in series (or cascade) such that the Q output of each of the N flip-flops is connected to the D input of the next (i.e., N+1) flip-flop. A first loop-back connection 340 should connect the Q output of the Nth, last or in this case 5th flip-flop with the D input of a first one of the N flip-flops. An exemplary embodiment should include a reset signal line 325 that's connected to a set input of each of the N flip-flops. The reset signal line 325 is used, when active, to RESET (or SET) each of the N flip-flops to a first voltage (logical level) or to a second voltage (logical level) in a first predetermined configuration. For example, when the division ratio is five, there are five flip-flops in the first loop-back flip-flop circuit such that N=5. The reset line 325 sets or resets each of the cascaded flip-flops of the first loop-back flip-flop circuit to a predetermined configuration of, for example, 00011, 11100 11000, or 00111. In this first loop-back flip-flop circuit, the clock input signal 302 is connected to clock each of the N flip-flops such that each of the N cascaded flip-flops are clocked on the rising edge of the clock signal. The first clock output line or positive flip-flop/loop-back output line provides an output from the Nth or last flip-flop of the cascaded first loop-back flip-flop circuit.

Such an embodiment further has the second loop-back circuit 308 having M flip-flops connected in series (in cascade) such that the Q output of each of the M flip-flops is connected to the D input of the next (i.e., M+1) flip flop. There is a second loop-back connection 338 that connects the Q output of the Mth, last or in this example the 5$^{th}$ flip-flop with the D input of the first of the M flip-flops. The reset signal line 325, in a manner similar to the first loop-back flip-flop circuit, is connected to each of the M flip-flops so that when the reset signal line is active each of the M flip-flops are RESET (or SET) to a first voltage (voltage) level or second voltage (a logical one or logical zero) in a second predetermined sequence. In some embodiments the second predetermined configuration is the same as the first predetermined configuration of logical ones and zeros that the first loop-back flip-flop circuit is reset or set to via the reset signal line. After the reset signal line goes inactive 330, the clock input signal line 302, being connected to each of the M flip-flops such that the M flip-flops are clocked on a falling clock edge 336 (rather than a rising clock edge) of the clock input signal so as to shift the predetermined sequence of logical ones and zeros through the second shift register in a manner that is timed to lead or follow the shifting of the first predetermined sequence of bits through the first loop-back flip flop circuit by one half of the clock input signal's period. The second loop-back circuit outputs a second clock output 338, which is connected to and the same as the second loop-back connection 338. Embodiments of the invention further include an OR gate or OR circuit 342 that is connected to receive the positive flip-flop/loop-back output (the first clock output) 340 and the negative flip-flop/loop-back output (the second clock output) 338 so as to OR these two signals and provide an odd division ration clock output 304 with respect to the clock input signal, having a 50% duty cycle.

Figure 5:
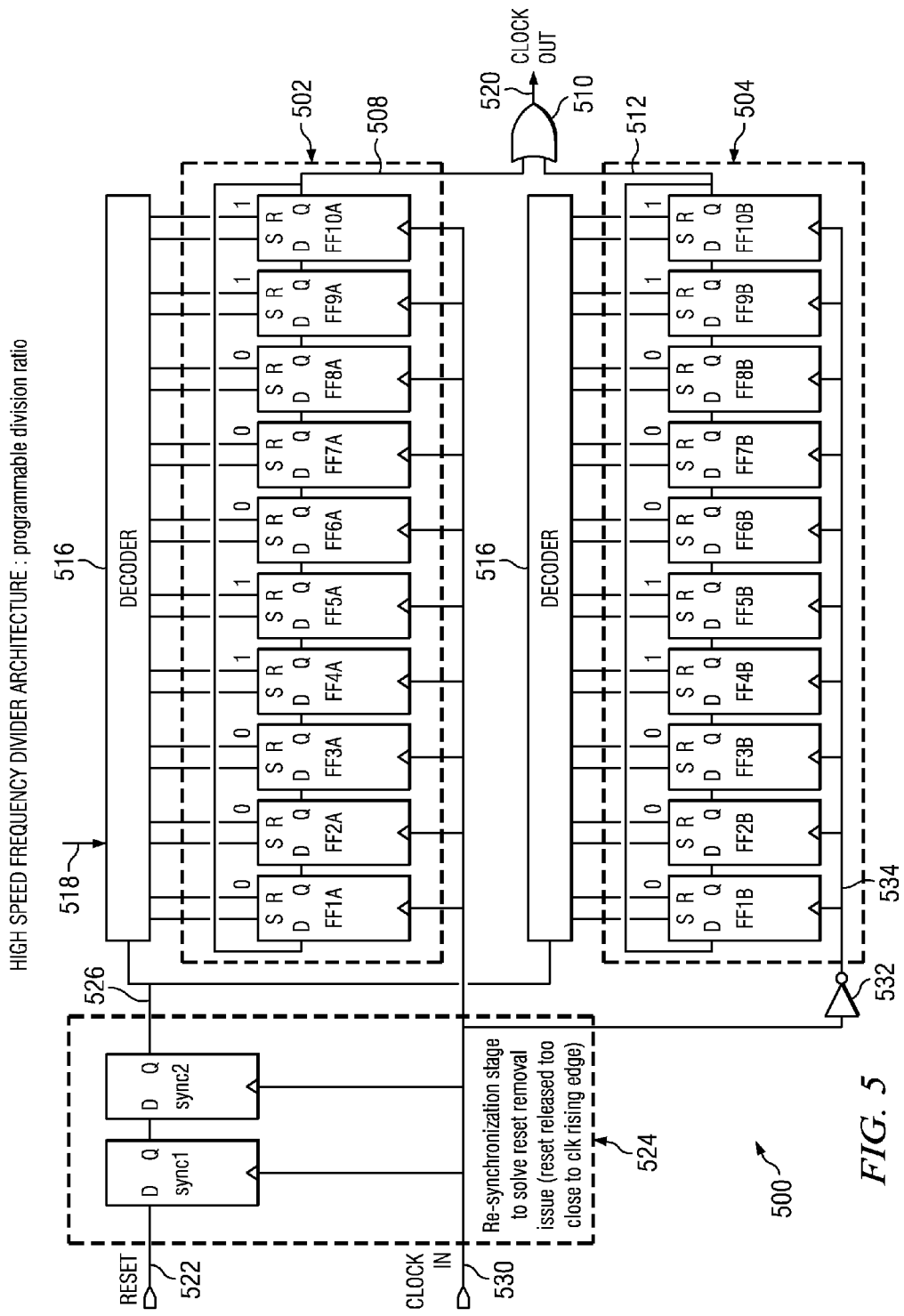
FIG. 5 is an exemplary programmable frequency divider architecture having dual ten flip-flop loop-back shift register circuits in accordance with an embodiment of the invention.

Referring now to FIG. 5, another embodiment of the invention is provided wherein the odd division ratio high-speed frequency divider architecture of FIG. 3 is modified to be an additional embodiment providing a high-speed programmable frequency divider architecture 500. In this embodiment a first loop-back shift register circuit 502 and a second loop-back shift register circuit 504 each comprise an equal number of N flip-flops connected in series or in cascade such that the Q output of each flip-flop is directly connected to the D input of the next flip-flop without any additional logic circuitry therebetween. In the depicted embodiment the first loop-backshift register 502 comprises ten flip-flops ff1A through ff10A and the second loop-back shift register 504 contains 10 flip-flops ff1B-ff10B. Thus, in this embodiment N is equal to 10, which equals the number of flip-flops. Each of the flip-flops ff1A through ff10A and ff1B through ff10B may comprise flip-flops having both asynchronous SET and RESET inputs. Furthermore, in the embodiment shown the asynchronous SET and RESET inputs are active high inputs, but other embodiments may utilize set and reset inputs that are active low. The first loop-back shift register 502 has a clock out P connection that electrically connects the Q output of flip-flop ff10A to the D input of flip-flop ff1A thereby completing the loop-back shift register. The clock out P line 508 is further connected to one input of an OR circuit 510. Similarly, the second loop-back shift register 504 has a clock-out N connection 512, which connects the Q output of the Nth or 10$^{th}$ flip-flop ff10B to the D input of the first flip-flop ff1B of the second loop-back shift register 504. The clock-out N connection 512 further is connected to a second input of the OR circuit 510.

A decoder circuit 516 receives a division ratio signal 518 from an external source. The division ratio signal 518 indicates the division ratio that the exemplary programmable frequency divider architecture is to be set to at the next active reset signal. The decoder circuit 516 provides SET and RESET connections to each of the flip-flops within the first loop-back shift register 502 and the second loop-back shift register 504. An unexpected finding of this exemplary embodiment is that certain division ratios can be programmed via the decoder 516 so as to produce a clock-out signal 520 having a 50% duty cycle. In particular, it was determined that if N=the number of flip-flops in one of the loop-back shift registers, then the division ratios available for programming are given by the factorization of the number N. For example, when N=10, its factorization equals 1*2*5*10. Thus, the programmable division ratios for a 10 flip-flop dual loop-back shift register frequency divider architecture are 2, 5, and 10. It is understood that generally a division ratio of 1 is normally not programmed. Thus, the available programmable division ratios that can produce a 50% duty cycle in an exemplary embodiment are 2, 5 and 10.

Still referring to FIG. 5, this exemplary embodiment receives a reset signal 522, which may be processed through a resynchronization circuit 524, which is known in the art for resolving reset issues due to a reset release (i.e., a reset, connected to a flip-flop with asynchronous reset, going to an inactive level too close to a rising edge of the clock input). The resynchronization circuit 524 provides a synchronized reset 526, which in this embodiment is an active high reset used to SET or RESET each of the flip-flops ff1A-ff10A and ff1B-ff10B. The clock-in signal 530 is provided to the first loop-back shift register 502 so as to clock each of the flip-flops ff1A-ff10B on a rising edge of the clock-in signal 530. The clock-in signal 530 is also provided to an inverter 532, which outputs an inverted clock signal 534 that is connected to the second loop-back shift register 504 flip-flops ff1B-ff10B so as to clock these flip-flops on a falling edge of the clock-in signal 530.

Figure 6:
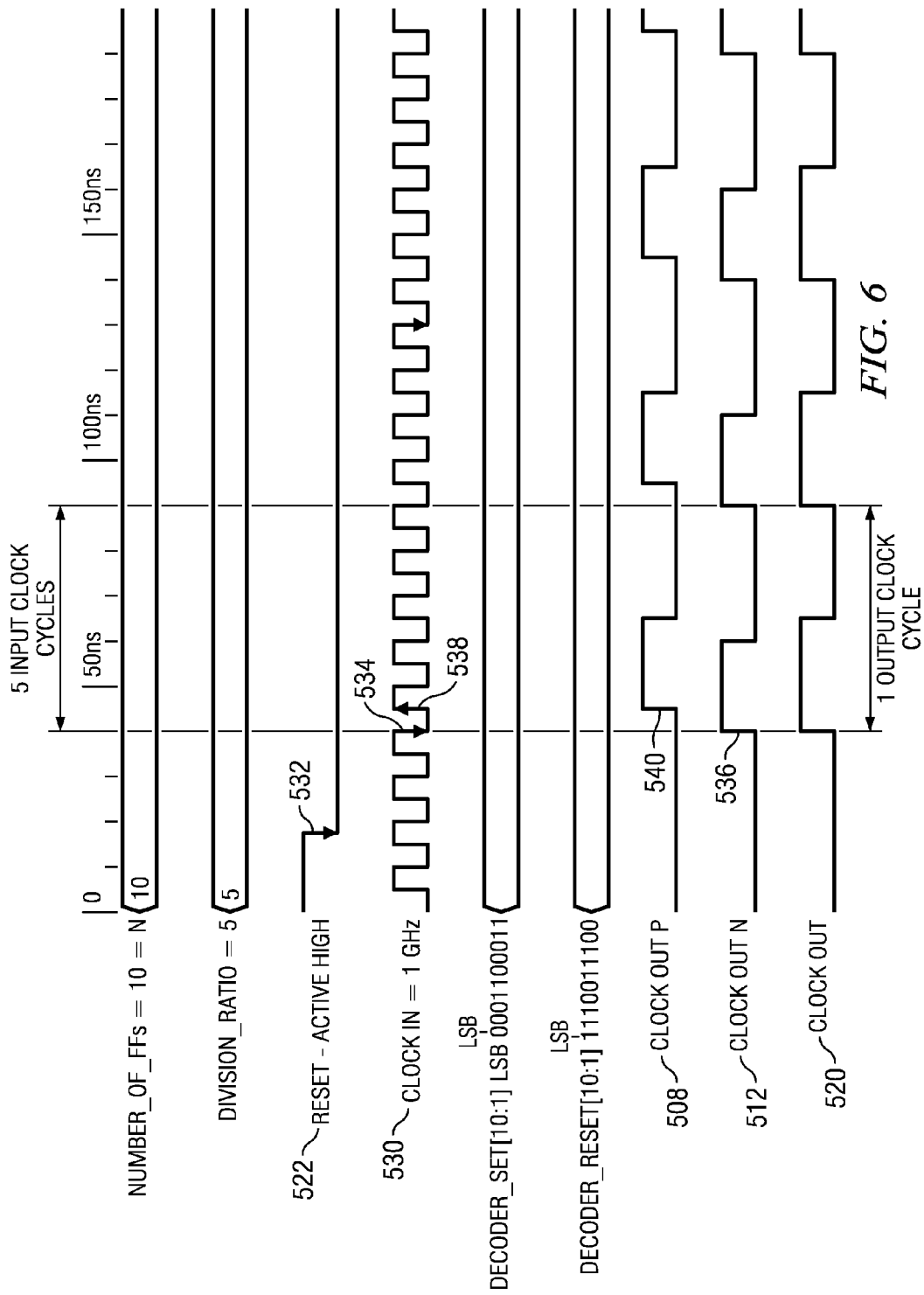
FIG. 6 depicts a signal timing diagram for the programmable frequency divider architecture of FIG. 5 when programmed with a division ratio of five.

Referring now to FIG. 6, a timing diagram for the exemplary programmable 10 flip-flop loop-back shift register frequency divider architecture 500 is provided. The timing diagram indicates that the clock-in signal 530 is operating at 1 GHz and that the reset signal 522 is an active high signal. In this timing diagram, the division ratio signal 518 sets the division ratio of the exemplary programmable frequency divider architecture 500 to be 5. Thus, during the synchronized active high reset 526 the decoder circuit 516 will either SET the flip-flops ff1A through ff10A and ff1B through ff10B to be 0001100011 wherein the first zero is the least significant bit (65B) that is input into the first flip-flop ff1A and ff1B. Conversely, if the decoder is set to provide a RESET signal to the ten flip-flops in the first and second loop-back shift register, then the decoder will provide a signal that RESETs each flip-flop starting with the ff1A and ff1B flip-flop with the bits 1110011100, respectively. After the reset signal 524 goes low 532 and another clock cycle occurs such that the synchronized reset 526 becomes inactive, then beginning on the next falling edge 534 of the clock signal 530 the bits set or reset into the second loop-back shift register 504 will shift one position for each clock cycle such that the clock-out and connection 512 will go high and stay high for 2 clock cycles and then go low and stay low for 3 clock cycles. As the second loop-back shift register continues to shift the programmed bits in the registers, the first rising edge 538 of the clock signal 530 (after the first falling edge 534) the first loop-back shift register 502 shifts the bits loaded therein such that the clock-output P signal 508 goes high one half of clock cycle after the clock-out N signal 512 went high as the bits 1100011000, shown in FIG. 5 that were SET by the decoder 516 shift through the first N second loop-back shift register's 502, 504 producing the signals 508, 512 shown in FIG. 6. The two inputs of the OR circuit 510 receives each of the clock-out P signal 508 and clock-out N signal 512 so as to produce the clock-out signal 520 which is the result of 5:1 division ratio from the clock-in signal 530 to the clock-out signal 520 and further has a 50% duty cycle.

Figure 7:
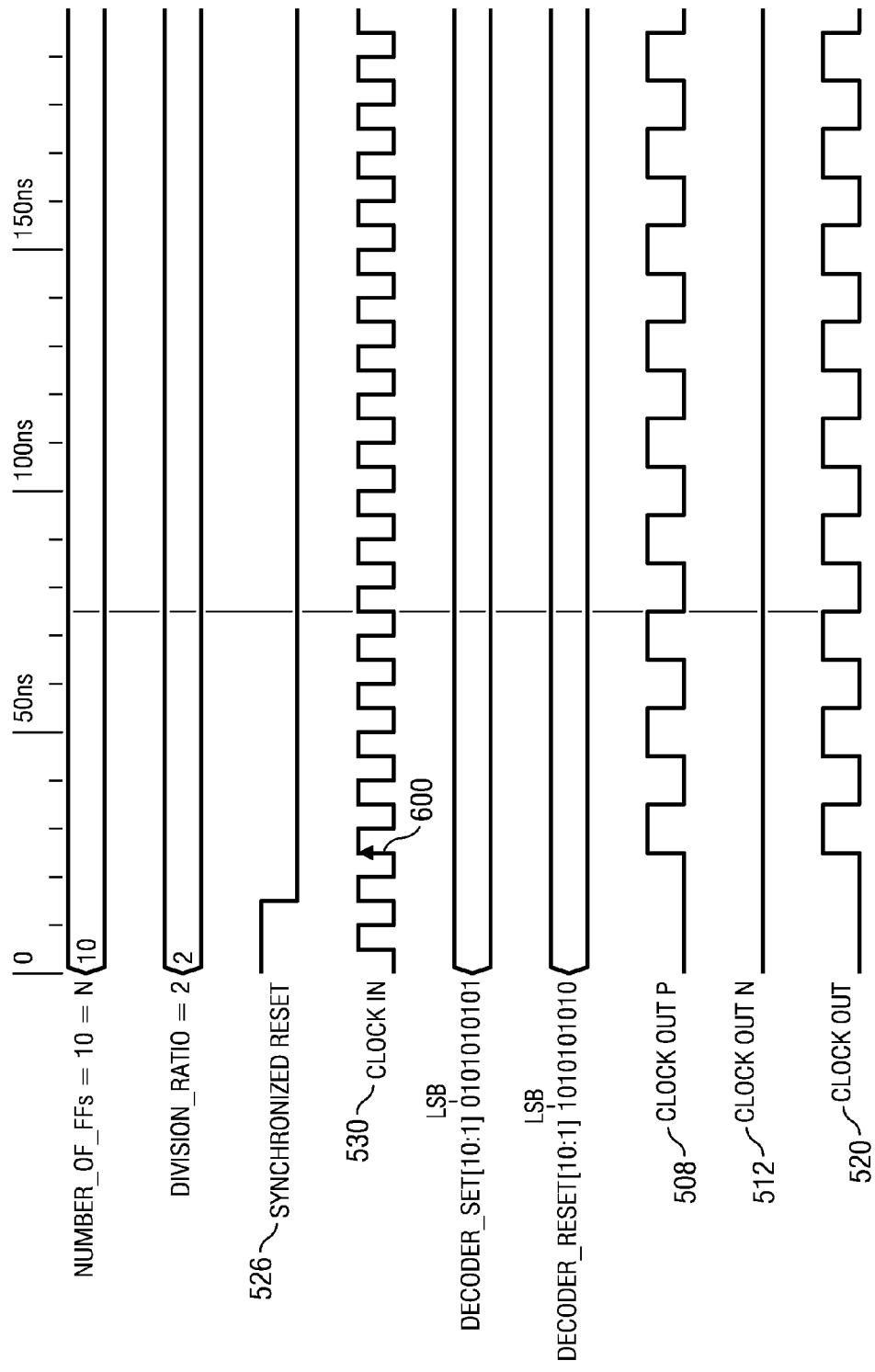
FIG. 7 depicts a signal timing diagram for the programmable frequency divider architecture of FIG. 5 when programmed with a division ratio of two.

Referring now to FIG. 7, a signal timing diagram for the programmable dual loop-back shift register frequency divider architecture 500 is shown wherein the division ratio is equal to 2. The number of flip-flops, N, in each of the two loop-back shift register circuits is still equal to 10. A division ratio signal 518 is provided to the decoder circuit 516 so as to set the division ratio to two. While the synchronized reset signal is active 526 the decoder circuit SETs or RESETs the flip-flops N the first loop-back shift register 502 with either a 0101010101 SET or a 1010101010 RESET while setting all of the flip-flops ff1B through ff10B in the second loop-back shift register 504 to be all zeros. As a result, after the reset signal 522 goes inactive, and depending on whether a resynchronization circuit 524 was used, the first loop-back shift register 502 will begin shifting on a rising edge 600 of the clock-in signal 530 thereby producing a clock-out P signal 508 to alternate from a logical high to a logical low on each clock cycle of the clock-in signal 530. Meanwhile, the second loop-back shift register, which was set to be all zeros, will provide a clock-out N signal 512 as a continuous logical low. The OR circuit 510 will OR the clock-out P signal 508 and the clock-out N signal 512 to produce a clock-out signal 520 having a division ratio of 2 with respect to the input clock signal 530.

Figure 8:
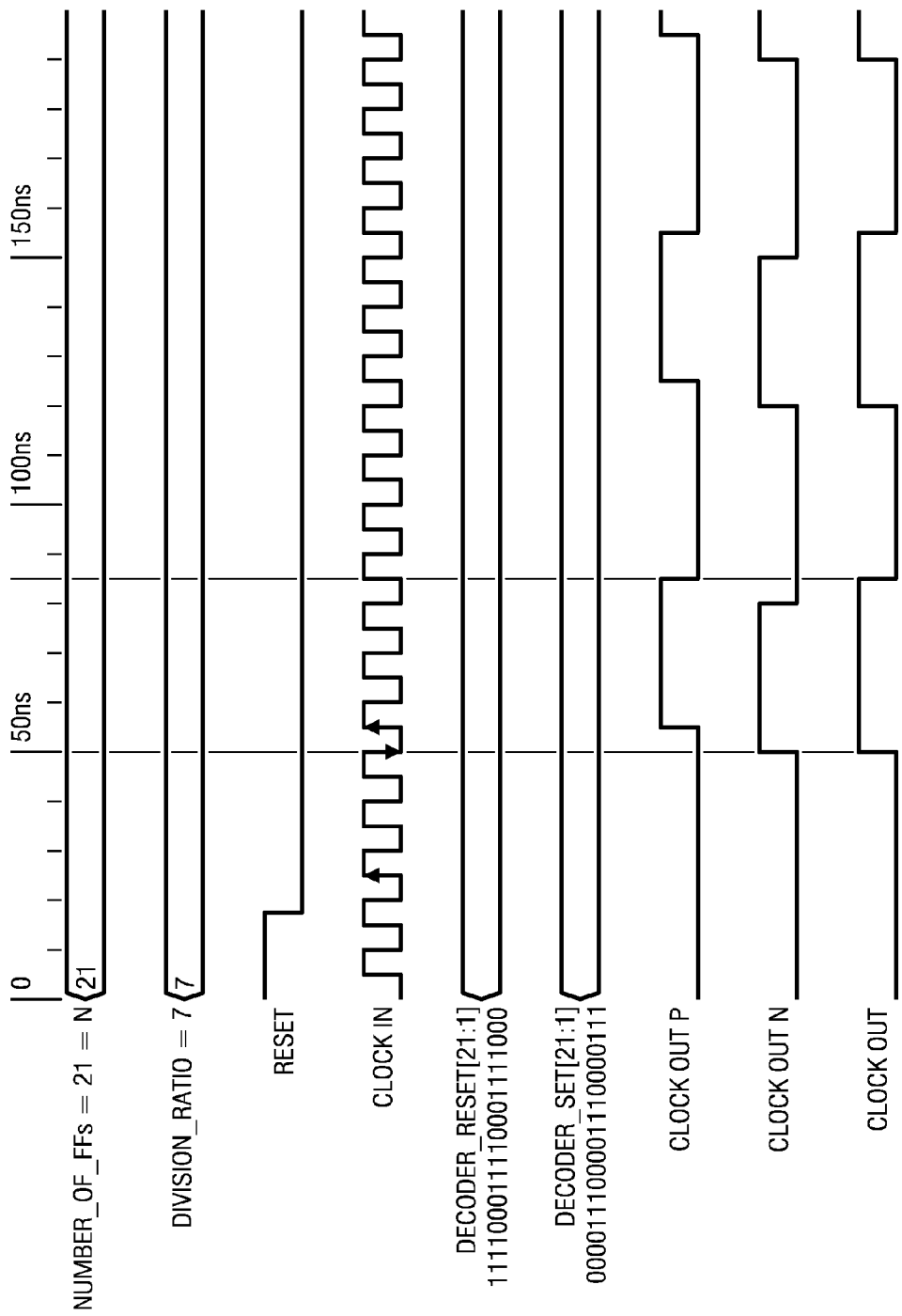
FIG. 8 depicts an exemplary signal timing diagram for an exemplary embodiment having dual twenty-one flip-flop loop-back shift register circuits wherein the division ratio is programmed to be seven.
Figure 9:
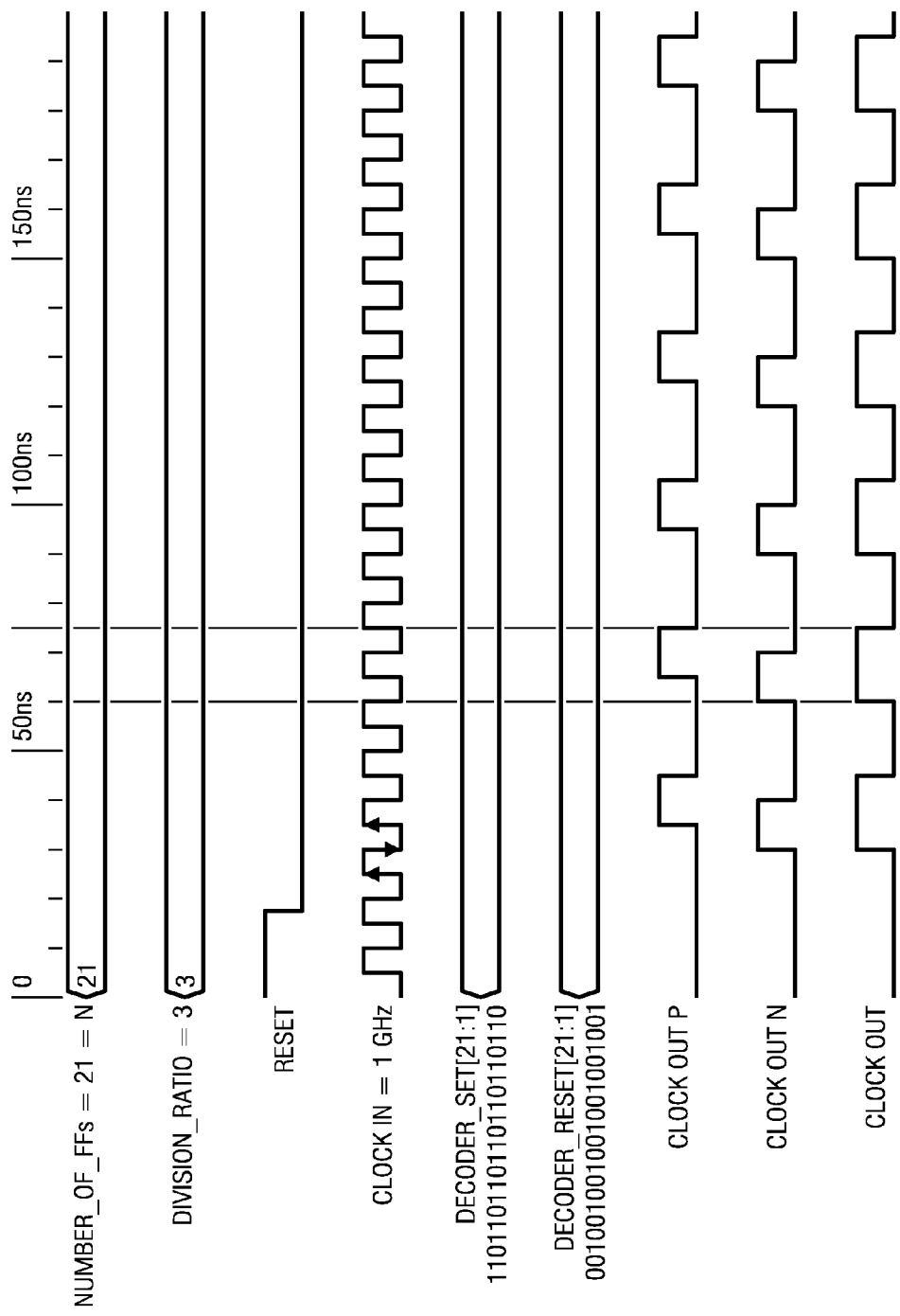
FIG. 9 depicts an exemplary signal timing diagram for an embodiment having dual two twenty-one flip-flop loop-back shift register circuits wherein the division ratio is programmed to be three.

FIGS. 8 and 9 provide clock timing diagrams for an exemplary embodiment of a programmable dual loop-back shift register divider architecture (not specifically shown) having N=21, such that the first and the second loop-back shift registers will each have 21 cascaded flip-flops connected similarly as described above. For example, in FIG. 8, when the division ratio is set to seven via division ratio input signal provided to a decoder circuit, then during an active reset signal the RESET or SET bits are used to set the 21 flip-flops in each of the two loop-back shift register or flip-flop circuits. On a first falling edge of a clock-in signal a predetermined number of clock cycles after the reset signal goes inactive, the shift register will begin shifting the, for example SET bits within the second loop-back shift register circuit so as to create the depicted clock-out N signal, which in this embodiment is high for three clock cycles and then low for four clock cycles. Meanwhile, the SET bits within the flip-flops of the first loop-back shift register circuit begin shifting on the first rising edge of the clock signal following the first falling edge of the clock-in signal to thereby begin shifting the SET bits through the first loop-back shift register to produce the clock-out P signal depicted in FIG. 8. The clock-out P signal and the clock-out N signal are then logically ORed to produce the divide by seven division ratio clock-out signal having a 50% duty cycle.

Referring now to FIG. 9, wherein N is still equal to 21, a timing chart for a programmed division ratio of 3 is depicted. Here, a decoder circuit is provided a division ratio signal of three and during an active high reset signal SETs or RESETs the flip-flops in the first and second 21 flip-flop loop-back circuit with the set or reset ones and zeros depicted in FIG. 9. After the reset signal becomes inactive, and the clock signal begins clocking and shifting the first loop-back shift register bits on rising edges of the clock signal and shifting the second loop-back shift register bits on falling edges of the clock signal. The clock-out P and clock-out N signals depicted are produced as outputs of the first and second loop-back shift registers respectively. The clock-out P and clock-out N signals (i.e., the first clock output and the second clock output) are logically ORed to produce a 50% duty cycle signal having a division ratio of three with respect to the input clock signal.

As can be seen in various embodiments of the invention there is no gate or logic delay present between any two flip-flops within the first or second loop-back shift registers. This allows the input clock frequency to be limited only by the maximum allowed frequency for the standard cell or particular flip-flop circuit design used in exemplary embodiments of the invention. In other words, the maximum clock-in frequency that may be used in an exemplary embodiment is not dependant on the selected or programmed frequency ratio designed into or selected for the circuit. The architecture described herein may be designed into integrated circuits using standard cell flip-flops as to enable fast design and implementation of an extremely high speed frequency divider circuit without the necessity for incorporating complex digital or analog circuits therein.

Although illustrated embodiments of the invention have been described, the foregoing description is not intended to limit the scope of the invention. Various modifications and combinations of the invention embodiments as well as other embodiments of the invention will be apparent to persons skilled in the art upon reference to this description. It is therefore intended that the appended claims incorporate any such modifications or embodiments.

It will also be appreciated by those skilled in the art having the benefit of this disclosure that embodiments of the present fixed or programmable dual loop-back shift register frequency divider architecture provides an improved apparatus and technique for dividing the frequency of an input clock signal having a low to a very high frequency, up to the maximum clock frequency allowed by the flip-flop or shift register circuit technology used. It should be understood that the drawings and detailed description herein are to be regarded in an illustrative rather than in a restrictive manner, and are not intended to be limiting to the particular forms and examples disclosed. On the contrary, included are any further modifications, changes, rearrangements, substitutions, alternatives, design choices, and embodiments apparent to those of ordinary skill in the art, without departing from the conceptual design, method and scope hereof as defined by the following claims. Thus, it is intended that the following claims be interpreted to embrace all such further modifications, changes, rearrangements, substitutions, alternatives, design choices, and embodiments.

What is claimed is:

1. A frequency divider architecture comprising:
   a first loop-back flip-flop circuit comprising:
      a first plurality of N flip-flops connected in a first series such that a Q output of each of the N flip-flops in the first series is connected to a D input of an immediately following flip-flop in the first series of flip-flops, and wherein a first loop-back connection connects the Q output of a last flip-flop in the first series with a D input of a first flip-flop in the first series of flip-flops;
      a first reset signal line connected to a set input of each of the N flip-flops in the first series of flip-flops, the first reset signal line adapted to reset each of the N flip-flops to a first logic level or a second logic level in a first predetermined configuration;
      a clock signal input line adapted to provide an input clock signal, the clock signal input line connected to each of the N flip-flops in the first series of flip-flops such that the N flip flops in the first series of flip-flops are clocked on a rising clock edge of the input clock signal; and a first clock output line connected to the first loop-back connection;

a second loop-back flip-flop circuit comprising:

a second plurality of M flip-flops connected in a second series such that a Q output of each of the M flip-flops in the second series is connected to a D input of an immediately following flip-flop in the second series of flip-flops, and wherein a second loop-back connection connects the Q output of a last flip-flop in the second series with a D input of a first flip in the second series of flip-flops;

a second reset signal line connected to each of the M flip-flops in the second series of flip-flops, the second reset signal line adapted to reset each of the M flip-flops to a first logic level or a second logic level in a second predetermined configuration;

the clock signal input line being connected to each of the M flip-flops such that the M flip-flops are clocked on a falling clock edge of the input clock signal; and a second clock output line connected to the second loop-back connection; and an OR gate having, a first input of the OR gate connected to the first clock output line and a second input of the OR gate connected to the second clock output line, and having an output for providing an output clock signal having a period that is an integer multiple of an input period of the input clock signal provided on the clock signal input line, wherein N and M are integers greater than 1.

2. The frequency divider architecture of claim 1, wherein the number of N flip-flops are equal to the number of M flip-flops, and the second reset signal line is connected to the first reset signal line, whereby the first reset signal and the second reset signal employ the a same reset signal.

3. The frequency divider architecture of claim 1, wherein the number of N flip-flops and the number of M flip-flops are equal.

4. The frequency divider architecture of claim 1, wherein when the number of N flip-flops and the number of M flip-flops are equal and an odd number, the output clock signal comprises a 50% duty cycle.

5. The frequency divider architecture of claim 1, wherein N is an odd number and the frequency divider architecture is adapted to provide a single division ratio of the input clock signal, and wherein and the reset signal line is adapted to SET the N flip flops such that the first predetermined configuration comprises the first [(N/2)−0.5] flip flops being set to the first logic level and the next [(N/2)+0.5] flip flops being set to the second logic level.

6. The frequency divider architecture of claim 5, wherein M is equal to N and the reset signal line is adapted to SET the M flip flops such that the second predetermined configuration comprises the first [(M/2)−0.5] flip flops being set to the first level and the next [(M/2)+0.5] flip flops being set to the second level.

7. The frequency divider architecture of claim 1, wherein the division ratio of the output clock frequency is fixed by the number of N and M flip-flops.

8. The frequency divider architecture of claim 1, wherein the frequency divider architecture is programmable, via the reset signal line, to provide an output clock signal having a division ratio comprising of any of the factors of N except 1.

9. The frequency divider architecture of claim 8, wherein the output clock signal comprises a 50% duty cycle.

10. A method of dividing an input clock by a number, the method comprising:

providing a first plurality of N flip-flops connected in a first loop-back configuration wherein an output of a last flip-flop is connected to an input of a first flip-flop of the first loop-back configuration;

providing a second plurality of M flip-flops connected in a second loop-back configuration wherein an output of a last flip-flop is connected to an input of a first flip-flop of the second loop-back configuration;

setting a first number of the first plurality of N and the second plurality of M flip-flops to contain a logical 0;

setting a second number of the first plurality of N and the second plurality of M flip-flops to contain a logical 1;

clocking the first plurality of N flip-flops on a rising edge of an input clock signal;

clocking the second plurality of M flip-flops on a falling edge of the input clock signal; and ORing the output of the last flip-flop of first loop back configuration and the output of the last flip-flop of the second loop-back configuration to provide a clock output signal having a 50% duty cycle and a clock output frequency having a predetermined division ratio with respect to the input clock signal's frequency, wherein N and M are integers greater than 1.

11. The method of claim 10, wherein N and M are equal odd integers and wherein:

setting the first number of the first plurality of N and the second plurality of M flip-flops further comprises setting [(N/2)−0.5] consecutive N and M flip-flops to a logical 0.

12. The method of claim 10, wherein N and M are equal odd integers and wherein;

setting the second number of the first plurality of N and the second plurality of M flip-flops further comprises setting [(N/2)+0.5] consecutive N and M flip-flops to a logical 1.

13. The method of claim 10, wherein prior to setting the first number and setting the second number steps, the method comprises:

receiving a division ratio signal by a decoder circuit, wherein the division ratio signal is adapted to comprise a division ratio equal to any factor of N except 1; and providing a reset signal to the decoder circuit thereby triggering the decoder circuit to provide a SET or RESET signal, in accordance with received division ratio signal, to the first plurality of N flip-flops and the second plurality of M flip-flops.

14. An electronic circuit comprising a frequency divider, wherein the frequency divider comprises:

a first loop-back flip-flop circuit comprising a first plurality of N of flip-flops connected in a first series comprising a first clock output connection that electrically connects an output of a last flip-flop in the first series to an input of a first flip-flop in the first series;

a second loop-back flip-flop circuit comprising a second plurality of M flip-flops connected in a second series comprising a second clock output connection that electrically connects an output of a last flip-flop in the second series to an input of a first flip-flop in the second series;

a reset signal adapted to cause a first number of flip-flops in the first loop-back flip-flop circuit to be set to a first logic level and to cause a second number of flip-flops in the second loop-back circuit to be set to the first logic level and to set the remaining flip-flops in the first and second loop-back circuits to a second logic level;

wherein the N flip-flops in the first loop-back circuit are adapted to be clocked by a rising edge of an input clock signal and the M flip-flops in the second loop-back circuit are adapted to be clocked by a falling edge of the input clock signal; and an OR circuit comprising a first input connected to the first clock output connection, a second input connected to the second clock output connection and an output adapted to provide an output clock having an output frequency equal to a selected frequency division ratio of the input clock signal and having a 50% duty cycle, wherein N and M are integers greater than 1.

15. The electronic circuit of claim 14, wherein the N and M are both odd and equal numbers and wherein the reset signal is adapted to cause a first number of consecutive [(N/2)−0.5] flip-flops in the first loop-back flip-flop circuit and the second loop-back flip-flop circuit to be set to the first logic level and to cause the remaining flip-flops in the first and the second loop-back flip flop circuits to be set to a second logic level.

16. The electronic circuit of claim 15, wherein the selected frequency division ratio is equal to the number of N flip-flops.

17. The electronic circuit of claim 14, further comprising a decoder circuit adapted to receive the reset signal and a division ratio signal, the division ratio signal comprising the selected frequency division ratio being a factor of N except 1, the decoder circuit further adapted to provide, upon receipt the reset signal and in accordance with the selected frequency division ratio, a SET or RESET signal to each of the first plurality of N flip-flops and each of the second plurality of M flip-flops.

18. The electronic circuit of claim 14, wherein the input clock signal has a frequency equal to or below $1/(t_{clk-Q}+t_s)$, wherein $t_{clk-Q}$ is equal to a maximum rated amount of time for a slowest one of the plurality of N or M flips-flops to output the first or second logic level therein after being clocked by an appropriate edge of the input clock signal, and wherein $t_s$ is equal to the maximum set-up time of for the slowest one of the plurality of N or M flip flops.

19. The electronic circuit of claim 14, wherein the electronic circuit is a portable computing unit.

20. The electronic circuit of claim 14, wherein the electronic circuit is a mobile telephone.

* * * * *